US006957966B2

(12) United States Patent
Martin et al.

(10) Patent No.: US 6,957,966 B2
(45) Date of Patent: Oct. 25, 2005

(54) COMPONENT RETENTION MECHANISM AND METHOD

(75) Inventors: Kenneth Martin, Morgan Hill, CA (US); Ghassan Shehad h, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 39 days.

(21) Appl. No.: 10/444,185

(22) Filed: May 23, 2003

(65) Prior Publication Data

US 2004/0233617 A1 Nov. 25, 2004

(51) Int. Cl.⁷ .............................. H01R 9/09; H05K 7/20
(52) U.S. Cl. ...................... 439/74; 439/331; 439/953; 361/719
(58) Field of Search .................... 439/331, 74, 487, 439/953; 361/704, 707, 709, 710, 711, 719; 257/719

(56) References Cited

U.S. PATENT DOCUMENTS

| 4,768,973 | A | * | 9/1988 | Bakermans ................. 439/331 |
| 5,044,975 | A | * | 9/1991 | DiBene et al. .............. 439/352 |
| 5,055,054 | A | * | 10/1991 | Doutrich ...................... 439/66 |
| 5,091,991 | A | * | 2/1992 | Briggs et al. ................. 385/82 |
| 5,173,057 | A | * | 12/1992 | Bunch et al. ............... 439/217 |
| 6,724,632 | B2 | * | 4/2004 | Lee et al. .................... 361/719 |

* cited by examiner

*Primary Examiner*—Neil Abrams

(57) ABSTRACT

One embodiment of the invention is a mechanism for attaching a first component to a second component, wherein the second component includes at least two mounting posts, the mechanism comprising a mounting block having at least two holes, through each of which a respective mounting post passes, and a retaining channel, whereby the at least two holes are located in the retaining channel; and a screw actuator that is located in the retaining channel, wherein the screw actuator includes an attachment portion that is fixedly attached to the mounting block and at least two sliding portions, whereby the at least two sliding portions move to engage the at least two mounting posts against a side of the retaining channel.

20 Claims, 2 Drawing Sheets

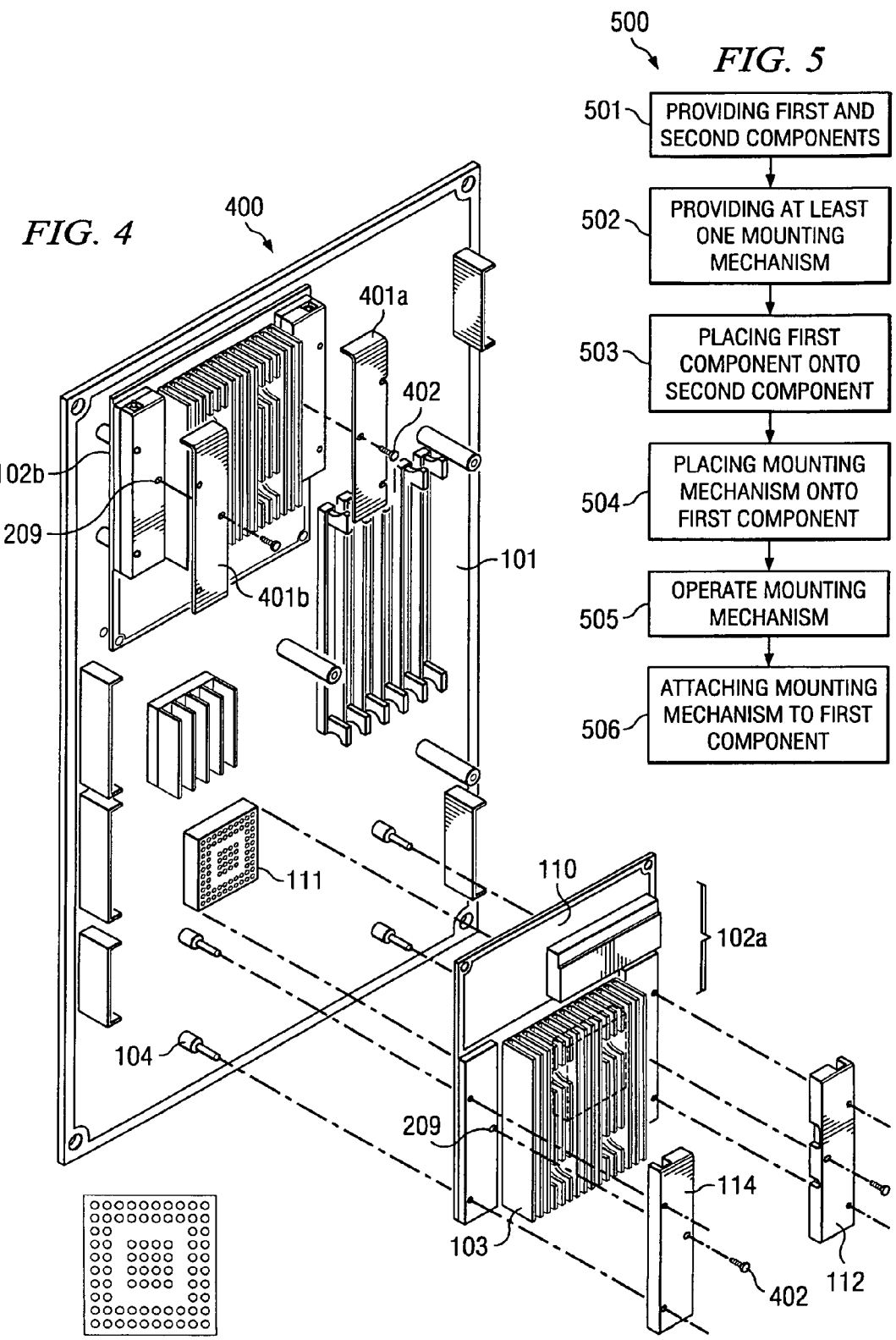

COMPONENT RETENTION MECHANISM AND METHOD

FIELD OF THE INVENTION

This invention relates in general to electronic devices, and in specific to a component retention mechanism and method.

BACKGROUND OF THE INVENTION

Heat sinks have become an important element in computer systems. As the processors in the systems have become faster, they also use more power, and thus generate more heat. Thus, heat sinks increase the surface area of the processors, and allow more heat to be dissipated from the processors.

To provide a good thermal conduction path with the processor, heat sinks are typically compressed downward onto the processor in their attachment with the processor. A tight fit with the processor ensures a conduction path. This arrangement operates quite satisfactorily for processors that are attached to the board via sockets. This type of attachment can withstand a relatively large compressive force.

However, another type of attachment is a ball grid array. With this type of attachment, the processor is soldered to board, with the solder connected being formed from a plurality of solder balls that are placed into a grid array. This type of attachment cannot withstand a relatively large compressive force. If a large force was to be applied to the processor, it would break the solder connections.

BRIEF SUMMARY OF THE INVENTION

One embodiment of the invention is a mechanism for attaching a first component to a second component, wherein the second component includes at least two mounting posts, the mechanism comprising a mounting block having at least two holes, through each of which a respective mounting post passes, and a retaining channel, whereby the at least two holes are located in the retaining channel; and a screw actuator that is located in the retaining channel, wherein the screw actuator includes an attachment portion that is fixedly attached to the mounting block and at least two sliding portions, whereby the at least two sliding portions move to engage the at least two mounting posts against a side of the retaining channel.

BRIEF DESCRIPTION OF THE DRAWINGS

FIG. 4 is an exploded view of an exemplary arrangement using embodiment of the invention; and FIG. 5 is a flow chart of a method according to an embodiment of the invention.

DETAILED DESCRIPTION OF THE INVENTION

Embodiments of the invention allow attachment of a first component to a second component such that limited or no compressive and lateral forces are applied to portions of the first component while still maintaining the mechanical integrity of the attachment of the first component to the second component. This is important when portions of the first component are connected to the second component via a ball grid array.

Figure 1:
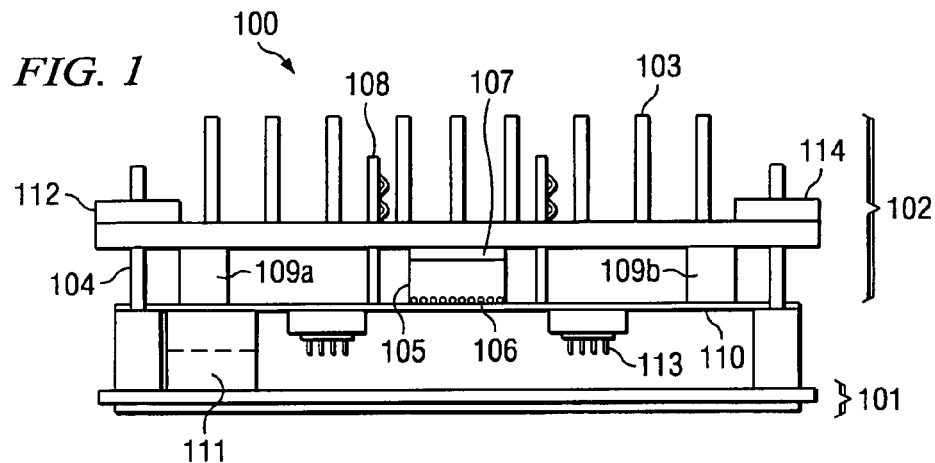
FIG. 1 is a side elevation view of an exemplary arrangement using embodiments of the invention.

FIG. 1 is a side elevation view of an exemplary arrangement 100 using embodiments of the invention. In this arrangement 100, a daughter card 102 is connected to a printed circuit board or motherboard 101. The daughter card 102 typically comprises a processor 105 that is connected to the daughter board 110 by a ball grid array (BGA) 106. The daughter card could further comprise one or more other devices, e.g. memory devices 113, that are connected to the daughter board 110. Note that this arrangement is by way of example only as other arrangements could be used, including but not limited to different cards, different devices, different numbers of devices, and/or different arrangements of devices.

The daughter card may also include an electromagnetic interference (EMI) shield 109a, 109b, which may be used to contain EMI energy being emitted by the processor 105, and/or inhibit EMI energy from an exterior source from reaching the processor 105. The EMI shield 109a, 109b, along with daughter board 110 and heat sink 103, would form a Faraday cage to block EMI energy.

The heat sink 103 typically is in thermal contact with the processor 105. To enhance the thermal contact between the heat sink and the processor, typically a thermal pad 107 is placed between the processor and the heat sink. The thermal pad fills in any voids from the roughness of the surface of the processor and the surface of the heat sink. This allows more surface area of the processor to contact more surface area of the heat sink, and thereby transfer more heat.

The heat sink 103 is typically connected to the daughter board by spring loaded retention pins 108. These pins will force the heat sink down onto the processor with a predetermined amount of force. In the arrangement 100 shown in FIG. 1, the downward force of the pins 108 is balanced with the EMI shield 109a, 109b. The downward force needs to be enough to provide good contact, but a large amount of force may damage the processor and/or break the solder connected of the BGA 106. A typical force would be in the range of 5–10 grams per solder ball. At 10 grams per ball, a 1153 ball array would have about 25 pounds of compressive force exerted on it. The pins 108 are attached to the daughter board 110. Alternatively, they may pass through holes in the daughter board, and have a head or other mechanism (not shown) to prevent their passage through the board.

In the arrangement shown in FIG. 1, the daughter card 102, including heat sink 103 would be placed onto mounting posts 104. The daughter card, including the heat sink would have holes to facilitate this placement. The posts 104 may be attached to the motherboard 101. Alternatively, they may pass through holes in the motherboard, and have a head or other mechanism (not shown) to prevent their passage through the motherboard. The motherboard 101 and daughter card 102 would typically comprise connectors 111 that electrically connects the daughter card 102 to the motherboard 101. The connections would be formed when the daughter card is placed onto the motherboard. The connections may comprise BGA connectors, surface mount connectors, or through-hole connectors.

After the daughter board has been placed onto the motherboard, connection mechanisms 112 and 114 are then attached to the mounting posts 104. The force of the attachment is lateral with respect to the mounting posts 104 (e.g. to the left/right of the page, and not down as shown in FIG. 1), and thus, does not contribute to the compressive force being exerted on the processor 105 and the BGA array. Examples of an embodiment of the attachment mechanisms 112, 114 is shown in FIGS. 2 and 3.

Figure 2:
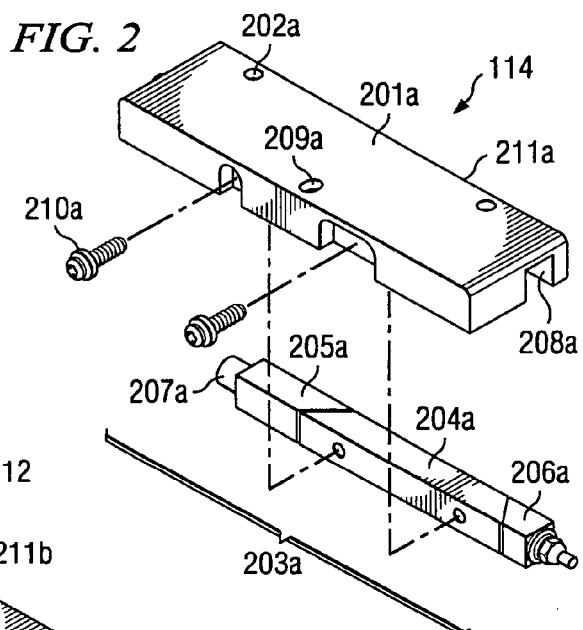
FIG. 2 is a perspective elevation view of an embodiment of the invention of a left retaining mechanism.
Figure 3:
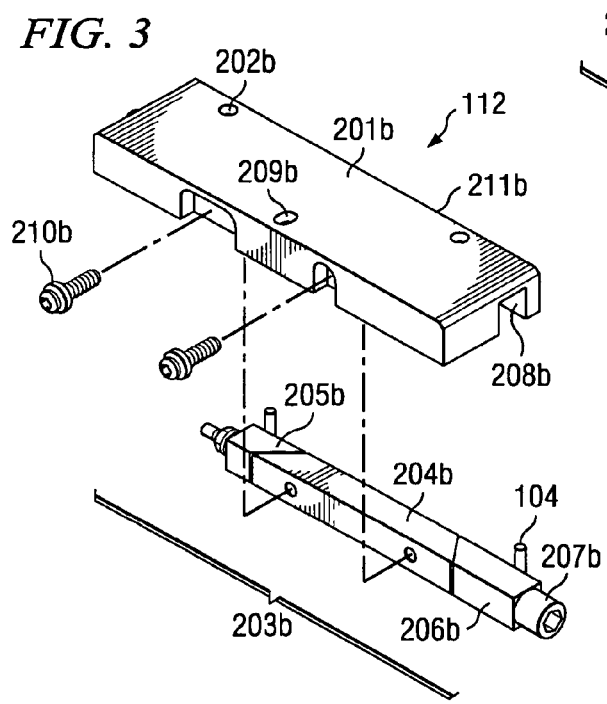
FIG. 3 is a perspective elevation view of an embodiment of the invention of a right retaining mechanism.

FIGS. 2 and 3 depict attachment mechanisms or mounting mechanisms 112, 114 that are mirror images to each other, consequently, elements of one appear in the other, and are labeled "a" and "b" accordingly, e.g. 202a and 202b. Since a discussion of one element describes the other, the elements will be referred to herein without the letter designation. Each attachment mechanism includes a mounting block 201. The lower surface of each mounting block would contact the daughter card 110, or as shown in FIG. 1, contacts the heat sink 103 that is connected to the daughter card. Each attachment mechanism has a plurality of holes 202 through which respective mounting posts would pass. Each attachment mechanism would have a retaining channel 208, and the holes 202 would typically pass through the channel. The holes would typically be located in the channel so as to be near one side or the other, such that the mounting posts would be close to one side of the channel, e.g. the side opposite screw 210.

Each attachment mechanism would include at least one screw actuator 203, that would be placed in the channel 208. The attachment portion 204 of the screw actuator 203 is attached to the mounting block 201 by fasteners 210. Each screw actuator 203 would also include one or more sliding wedge portions 205, 206. Each screw actuator 203 would include a screw (or socket) head 207 that enables actuation. As the screw is rotated, the sliding wedges would slide along the wedge surfaces of the attachment portion, causing the wedges to move outward to engage the mounting posts against the side 211 of mounting block 201. The sliding wedges move until the mounting posts are sufficiently squeezed under a predetermined pressure. With the action of the wedges, the attachment mechanism floats against the heat sink. The pressure necessary to retain the mounting mechanisms in place is dependent upon the diameter of the mounting posts, the space inside the retaining channel within which the screw actuator is permitted to expand, and the actuation torque of the screw actuator. Note that the blocks are floating, thus, no lateral or compressive loads are imparted to the processor or BGA during actuation. Once the wedges are in place, the heat sink is prevented from moving vertically away from the processor, as well as laterally. The mounting mechanism is then secured to the heat sink of the daughter card by a fastener (402 of FIG. 4) placed in attachment hole 209 to prevent the heat sink from moving down onto the processor. Downward motion of the heat sink could damage the processor 105, the BGA connections 106 of the processor, or the BGA connections of the connector 111 (if used). Thus retention is as such: the heat sink is rigidly attached to the mounting mechanisms, which in turn are attached to the mounting posts, which in turn are attached to the motherboard.

As stated earlier, FIGS. 2 and 3 depict attachment mechanisms 112, 114 that are mirror images to each other. This would allow the screw actuator 203 to be operated from the same side of the board 101. However, the attachment mechanisms may be identical, with one mechanism oriented such that the screw actuator 203 is operated from one side of the board 101 and the other mechanism oriented such that the screw actuator 203 is operated from the other side of the board.

Furthermore, the embodiments of the attachment mechanisms 112, 114 shown in FIGS. 2 and 3 are by way of example only, as other arrangements could be used. For example, instead of a single screw actuator 203 being used, a plurality of actuators could be used. For example, each actuator could be oriented such that the screw head is located on same side as screw 210.

FIG. 4 is an exploded view of an exemplary arrangement 400 using an embodiment of the invention. In this arrangement 400, two daughter cards 102a, 102b are connected to the motherboard 101 using embodiment of the invention shown in FIGS. 1, 2, and 3. Daughter card 102b includes optional mounting mechanism covers 401a, 401b, which may be placed over the mounting mechanisms and secured by screw 402 in hole 209.

FIG. 5 is a flow chart of a method 500 according to an embodiment of the invention. This method is by way of example only as other methods could be used to perform embodiments of the invention. The method begins by providing first and second components 501, for example the daughter card 102 with the attached heat sink 103, and the motherboard 101. The first component typically would have at least two holes through which respective mounting posts of the second component would pass. The method would then provide at least one mounting mechanism 502, for example the mechanisms 112, 114 of FIGS. 2 and 3. The mounting mechanism would typically have two holes through which respective mounting posts of the second component would pass. The method would then place the first component onto the second component 503, and then place the mounting mechanism onto the first component 504. The method would then operate the mounting mechanism 505 to attach the mounting mechanism to the mounting posts. The operation of the mounting mechanism could cause two sliding portions of the mounting mechanism to engage the two mounting posts against a side of the retaining channel of the mounting mechanism. The two sliding portions could be moved by rotating a screw actuator that passes through the two sliding portions. The sliding portions typically comprise wedges, and operating the mounting mechanism causes each wedge to move along a respective wedge face of the mounting mechanism such that each wedge moves laterally to engage a respective mounting post against the side of the retaining channel. As shown in FIGS. 1 and 4, there may be more than two mounting posts, e.g. 4 posts, and more than one mounting mechanism may be used, e.g. two mechanisms. After the operation of the mounting mechanism, the mounting mechanism may be attached to the first component 506.

Although the invention has been described in terms of heat sinks, BGAs, and processors, the invention would operate with other devices. The invention would be operative where a force to retain components together is desired to be applied in a direction that is orthogonal to the placement of the components, e.g. vertical placement a lateral force. The components are not necessarily limited to electronic components, but may be other types of components as well.

What is claimed is:

1. A mechanism for attaching a first component to a second component, wherein the second component includes at least two mounting posts, the mechanism comprising:

a mounting block having at least two holes, through each of which a respective mounting post passes, and a retaining channel, whereby the at least two holes are located in the retaining channel; and a screw actuator that is located in the retaining channel, wherein the screw actuator includes a attachment portion that is fixedly attached to the mounting block and at least two sliding portions, whereby the at least two sliding portions move to engage the at least two mounting posts against a side of the retaining channel.

2. The mechanism of claim 1, wherein the first component comprises at least two holes, through each of which a respective mounting post passes.

3. The mechanism of claim 1, wherein the mounting block is attached to the first component.

4. The mechanism of claim 1, wherein the screw actuator comprises:
a screw that passes through the attachment portion and the at least two sliding portions.

5. The mechanism of claim 1, wherein each of at least two sliding portions comprises:
a wedge;
wherein each wedge contacts a respective wedge face of the attachment portion, whereby rotation of the screw actuator moves each wedge along the wedge face such that each wedge moves laterally with respect to the screw actuator.

6. The mechanism of claim 1, wherein the at least two mounting posts comprises four mounting posts, and the mechanism further comprises:
another mounting block; and
another retaining block;
wherein the mounting block and the retaining block are associated with one pair of mounting posts, and the another mounting block and the another retaining block are associated with the other pair of mounting posts.

7. The mechanism of claim 1, wherein the second component is a board.

8. The mechanism of claim 1, wherein the first component is a daughter card which comprises:
a daughter board;
a processor that is attached to the daughter board; and
a heat sink that is in thermal contact with the processor and enhances heat dissipation from the processor.

9. The mechanism of claim 8, wherein the daughter card further comprises:
a thermal pad that is located between the processor and the heat sink, and provides a thermal conduction path from the processor to the heat sink.

10. The mechanism of claim 8, wherein the processor is attached to the daughter board by a ball grid array.

11. The mechanism of claim 10, wherein at least one ball in the ball grid array is subjected to no greater than 10 grams of compressive force.

12. The mechanism of claim 8, wherein the heat sink is attached to the daughter card by a plurality of spring retainers.

13. The mechanism of claim 8, wherein the heat sink and the daughter board each have at least two holes, through each of which a respective mounting post passes.

14. The mechanism of claim 8, wherein the daughter card further comprises:
an electromagnetic interference (EMI) shield that is located between the heat sink and the daughter board, and reduces the transmission of EMI between the processor and an external environment.

15. A method for attaching a first component to a second component comprising:
providing two mounting posts on the second component and two holes in the first component;
providing a mounting mechanism having two holes, and a retaining channel, whereby the two holes are located in the retaining channel;
placing the first component onto the second component such that each respective mounting post passes through a respective hole;
placing the mounting mechanism onto the first component such that a respective mounting post passes through a respective hole; and
operating the mounting mechanism thereby causing two sliding portions of the mounting mechanism to engage the two mounting posts against a side of the retaining channel.

16. The method of claim 15 further comprising:
attaching the mounting mechanism to the first component.

17. The method of claim 15, wherein the operating the mounting mechanisms comprises:
rotating a screw that passes through the two sliding portions.

18. The method of claim 15, wherein each of at least two sliding portions comprises a wedge, and operating the mounting mechanism comprises:
moving each wedge along a respective wedge face of the mounting mechanism such that each wedge moves laterally to engage a respective mounting post against the side of the retaining channel.

19. The method of claim 15, wherein the two mounting posts comprise a first pair of mounting posts, and two other mounting posts comprise a second pair of mounting posts, and the method further comprises
providing another mounting mechanism, wherein the mounting mechanism is associated with the first pair of mounting posts, and the another mounting mechanism is associated with the second pair of mounting posts;
placing the another mounting mechanism onto the first component such that each respective mounting post of the second pair of mounting posts passes through a respective hole; and
operating the another mounting mechanism thereby causing two sliding portions of the another mounting mechanism to engage the second pair of mounting posts against a side of the retaining channel.

20. A mechanism for attaching a first component to a second component, wherein the first component includes at least two holes and second component includes at least two mounting posts, whereby a respective mounting post passes through a respective hole, the mechanism comprising:
means for engaging a portion of the first component; and
means for engaging the at least two mounting posts to prevent movement of the first component along a direction of the mounting posts;
wherein the mechanism reduces movement of the first component with respect to the second component using a force applied in an orthogonal direction to the direction of the mounting posts; and
wherein the means for engaging the at least two mounting posts operates without exerting a compressive force on the first component.

* * * * *

UNITED STATES PATENT AND TRADEMARK OFFICE
CERTIFICATE OF CORRECTION

| | |
|---|---|
| PATENT NO. | : 6,957,966 B2 |
| APPLICATION NO. | : 10/444185 |
| DATED | : October 25, 2005 |
| INVENTOR(S) | : Kenneth Martin et al. |

It is certified that error appears in the above-identified patent and that said Letters Patent is hereby corrected as shown below:

On the title page, item (75), in "Inventors", in column 1, line 2, delete "Shehad h" and insert -- Shehadeh --, therefor.

Signed and Sealed this

Eleventh Day of August, 2009

David J. Kappos
*Director of the United States Patent and Trademark Office*